United States Patent
Fan et al.

(10) Patent No.: US 11,234,328 B2
(45) Date of Patent: Jan. 25, 2022

(54) CIRCUIT BOARD

(71) Applicant: CHIPBOND TECHNOLOGY CORPORATION, Hsinchu (TW)

(72) Inventors: Chia-En Fan, Hsinchu County (TW); Hui-Yu Huang, Hsinchu (TW); Chih-Ming Peng, Taichung (TW); Chun-Te Lee, Hsinchu County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/032,244

(22) Filed: Sep. 25, 2020

(65) Prior Publication Data
US 2021/0267047 A1 Aug. 26, 2021

(30) Foreign Application Priority Data
Feb. 26, 2020 (TW) ................. 109106342

(51) Int. Cl.
*H05K 1/02* (2006.01)
*H05K 1/11* (2006.01)

(52) U.S. Cl.
CPC ......... *H05K 1/0268* (2013.01); *H05K 1/0286* (2013.01); *H05K 1/111* (2013.01); *H05K 2201/09254* (2013.01)

(58) Field of Classification Search
CPC .............. H05K 1/0268; H05K 1/0286–0296
See application file for complete search history.

(56) References Cited

U.S. PATENT DOCUMENTS

| 7,307,222 B2 * | 12/2007 | Parker ............... G01R 31/2805 174/261 |
| 2006/0091510 A1 | 5/2006 | Liu et al. |
| 2009/0153791 A1 | 6/2009 | Chang et al. |
| 2011/0203840 A1 | 8/2011 | Wu |
| 2015/0241471 A1 | 8/2015 | Hsu |

FOREIGN PATENT DOCUMENTS

JP 2000-165006 A 6/2000

OTHER PUBLICATIONS

Taiwanese Office Action dated Sep. 3, 2021 for Taiwanese Patent Application No. 109106342, 4 pages.

* cited by examiner

*Primary Examiner* — Jeremy C Norris
(74) *Attorney, Agent, or Firm* — Demian K. Jackson; Jackson IPG PLLC

(57) ABSTRACT

A circuit board disclosed in the present invention includes a substrate and a circuit layer. The circuit layer is formed on a surface of the substrate and includes at least one test circuit line. The test circuit line includes a main segment and a branch segment connected with each other. The branch segment is provided to be contacted with a test equipment for electrical test so as to protect the main segment from breaking during electrical test.

14 Claims, 5 Drawing Sheets

CIRCUIT BOARD

FIELD OF THE INVENTION

This invention relates to a circuit board, and more particularly to a circuit board having test circuit line.

BACKGROUND OF THE INVENTION

Conventionally, test pads in circuit pattern are provided for electrical test of circuit board. In order to visually find the test pads, the test pads are designed to have wider line than other circuit lines. After confirming the position of the test pad, a test equipment is moved to above the test pad to allow a probe to contact the test pad for electrical test. However, line damage is easy to occur at the junction of the test pad and circuit line due to width difference to cause circuit failure.

SUMMARY

One object of the present invention is to provide a circuit board having test circuit line, branch segment of the test circuit line is designed to be contacted with a test equipment in order to protect main segment of the test circuit line from breaking.

A circuit board of the present invention includes a substrate and a circuit layer that is formed on a surface of the substrate and includes at least one test circuit line. The test circuit line includes a main segment and a branch segment that is connected to the main segment and located between a first terminal and a second terminal of the main segment. The branch segment is provided to be contacted with a test equipment for electrical test.

In the present invention, the test equipment contacts the branch segment for electrical test, not contact the main segment such that the main segment is protected from breaking during test. Furthermore, even if the branch segment is damaged during manufacture, delivery or test process, the main segment is still available to be electrically connected to other electronic device without failure risk resulted from the broken branch segment.

DETAILED DESCRIPTION OF THE INVENTION

Figure 1:
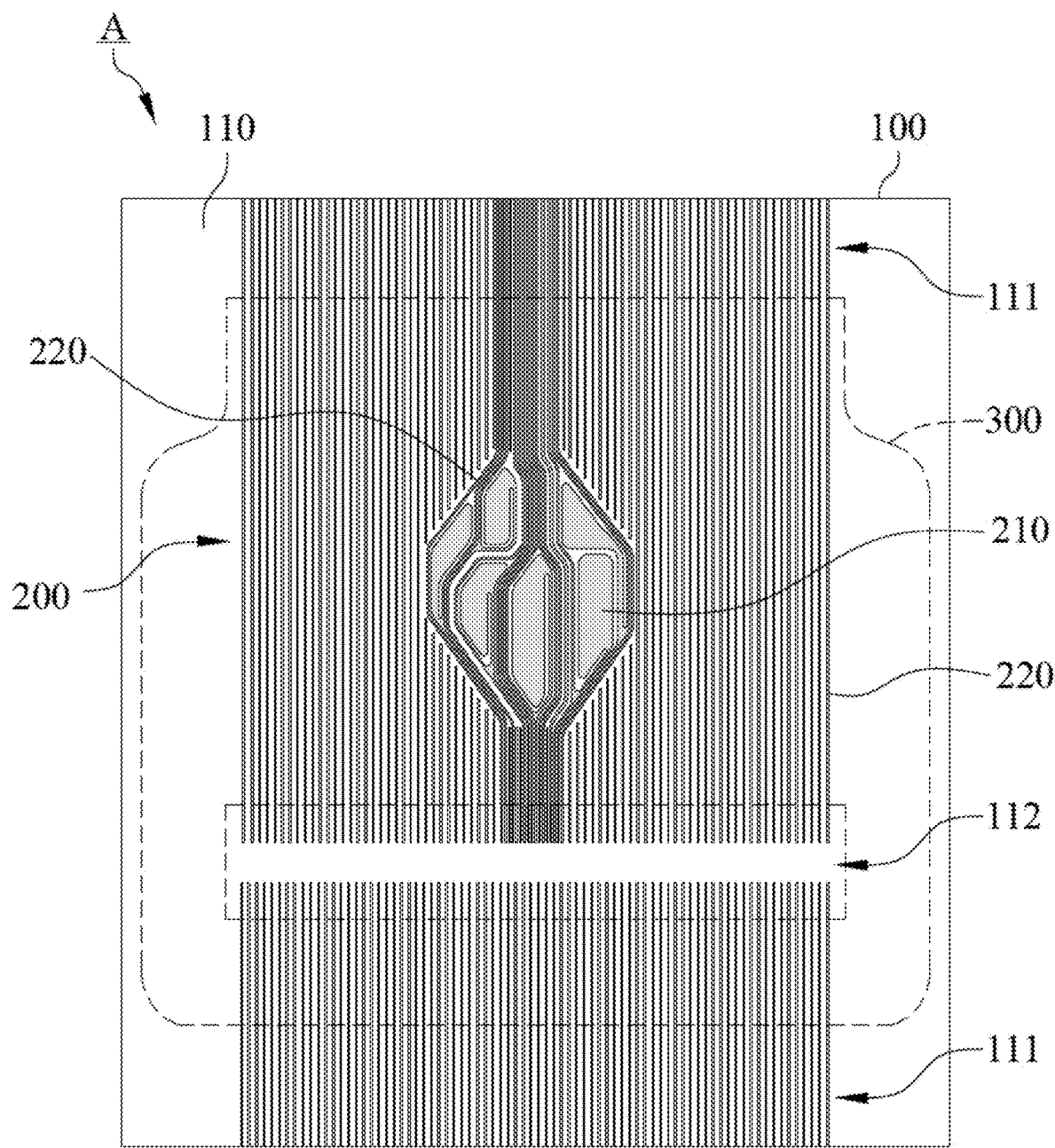
FIG. 1 is a top view diagram illustrating a circuit board in accordance with a preferred embodiment of the present invention.

With reference to FIG. 1, a circuit board A in accordance with a preferred embodiment of the present invention includes a substrate 100 and a circuit layer 200 that is formed on a surface 110 of the substrate 100. The substrate 100 may be made of polyimide (PI), polyethylene terephthalate (PET), glass, ceramic, metal or other material, and the circuit layer 200 may be made of copper (Cu), nickel (Ni), gold (Au) or other metal or alloy. In this embodiment, the circuit board A is a flexible copper clad laminate (FCCL) with fine patterns.

With reference to FIG. 1, an outer bonding area 111 and an inner bonding area 112 are defined on the surface 110 of the substrate 100. Preferably, there are two outer bonding areas 111 and one inner bonding area 112 defined on the surface 110, the outer bonding areas 111 are located at both sides of the surface 110 respectively, and the inner bonding area 112 is located between the outer bonding areas 111.

Figure 2:
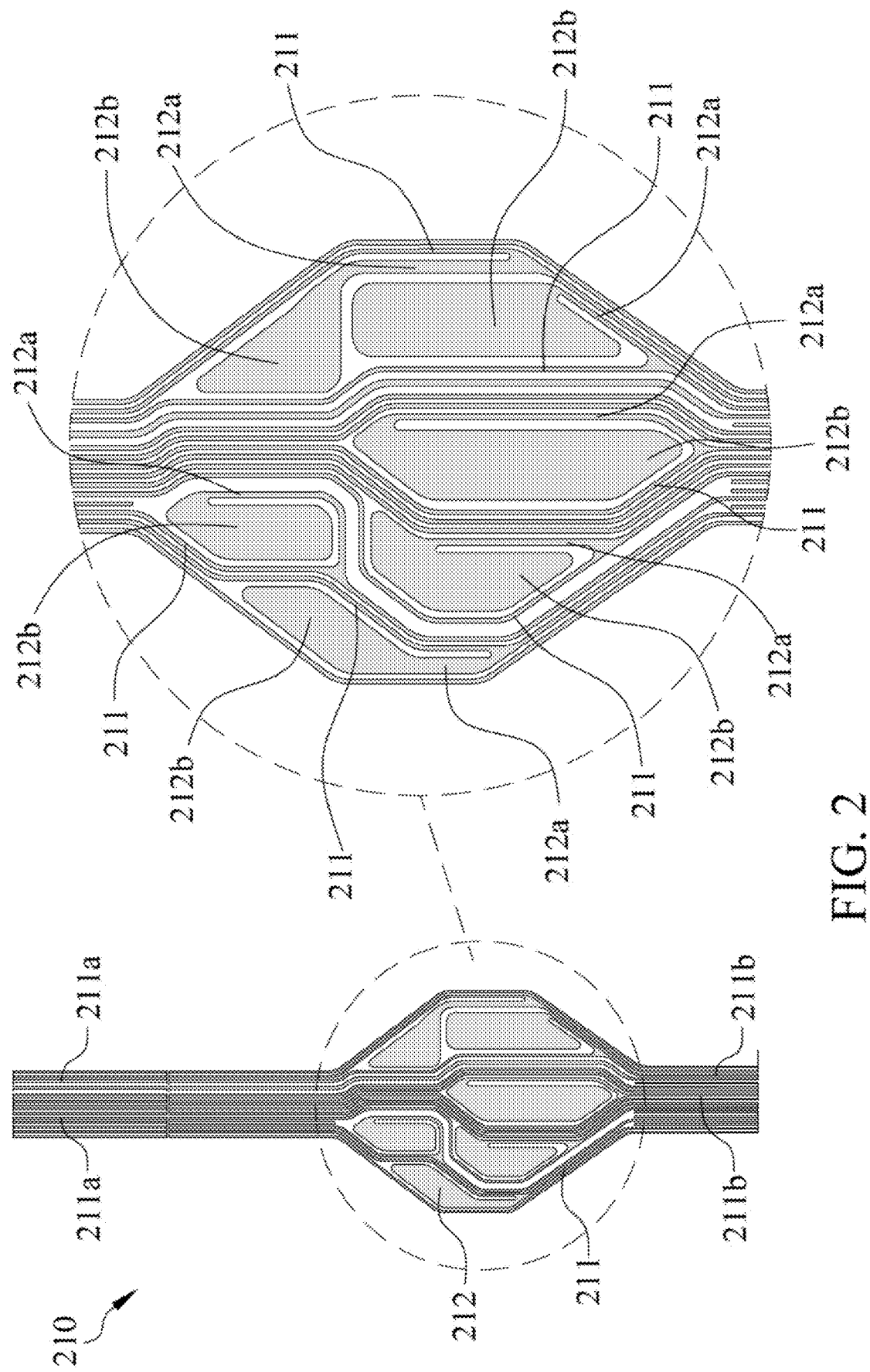
FIG. 2, is a top view diagram illustrating a test circuit line in accordance with a preferred embodiment of the present invention.

With reference to FIGS. 1 and 2, the circuit layer 200 includes at least one test circuit line 210 that includes a main segment 211 and a branch segment 212. A first terminal 211a and a second terminal 211b of the main segment 211 are located on the outer bonding area 111 and the inner bonding area 112 respectively, and provided to bond with an electronic device (not shown) and a chip (not shown), respectively. The branch segment 212 is connected to the main segment 211 and located between the first terminal 211a and the second terminal 211b, but not connected to the first terminal 211a or the second terminal 211b. The branch segment 212 is provided for electrical test by contacting with a test equipment (not shown), the test equipment may be probe set or other electrical test equipment.

The test equipment doesn't contact the main segment 211 during electrical test, for this reason, the main segment 211 is protected from breaking caused by improper operation of the test equipment. Even if the branch segment 212 is broken because of inappropriate force, the main segment 211 is still available to be electrically connected to the electronic device and the chip through the first terminal 211a and the second terminal 211b. The main segment 211 is prevented from failure due to the broken branch segment 212.

Figure 3:
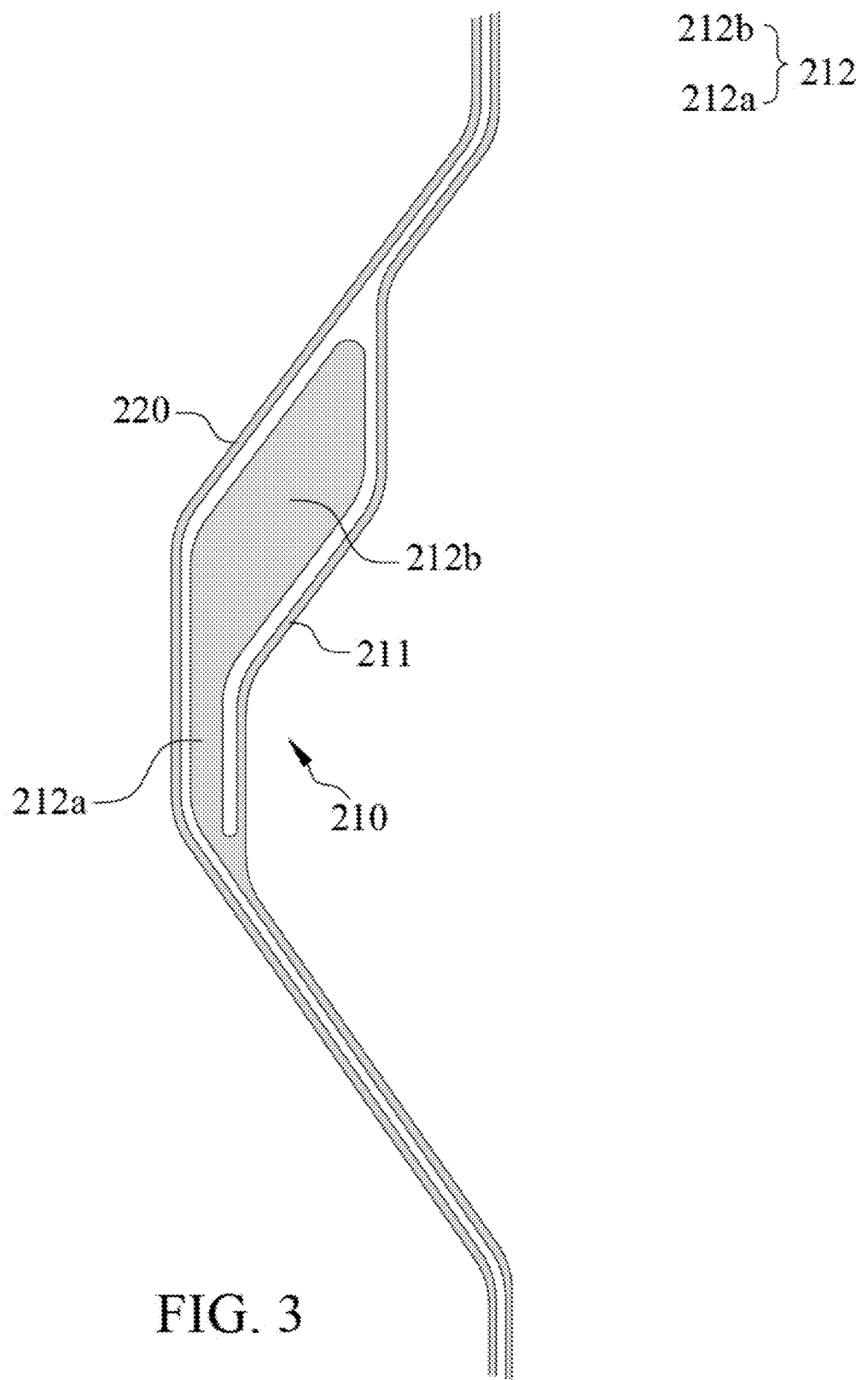
FIG. 3 is a top view diagram illustrating a test circuit line in accordance with a preferred embodiment of the present invention.
Figure 4:
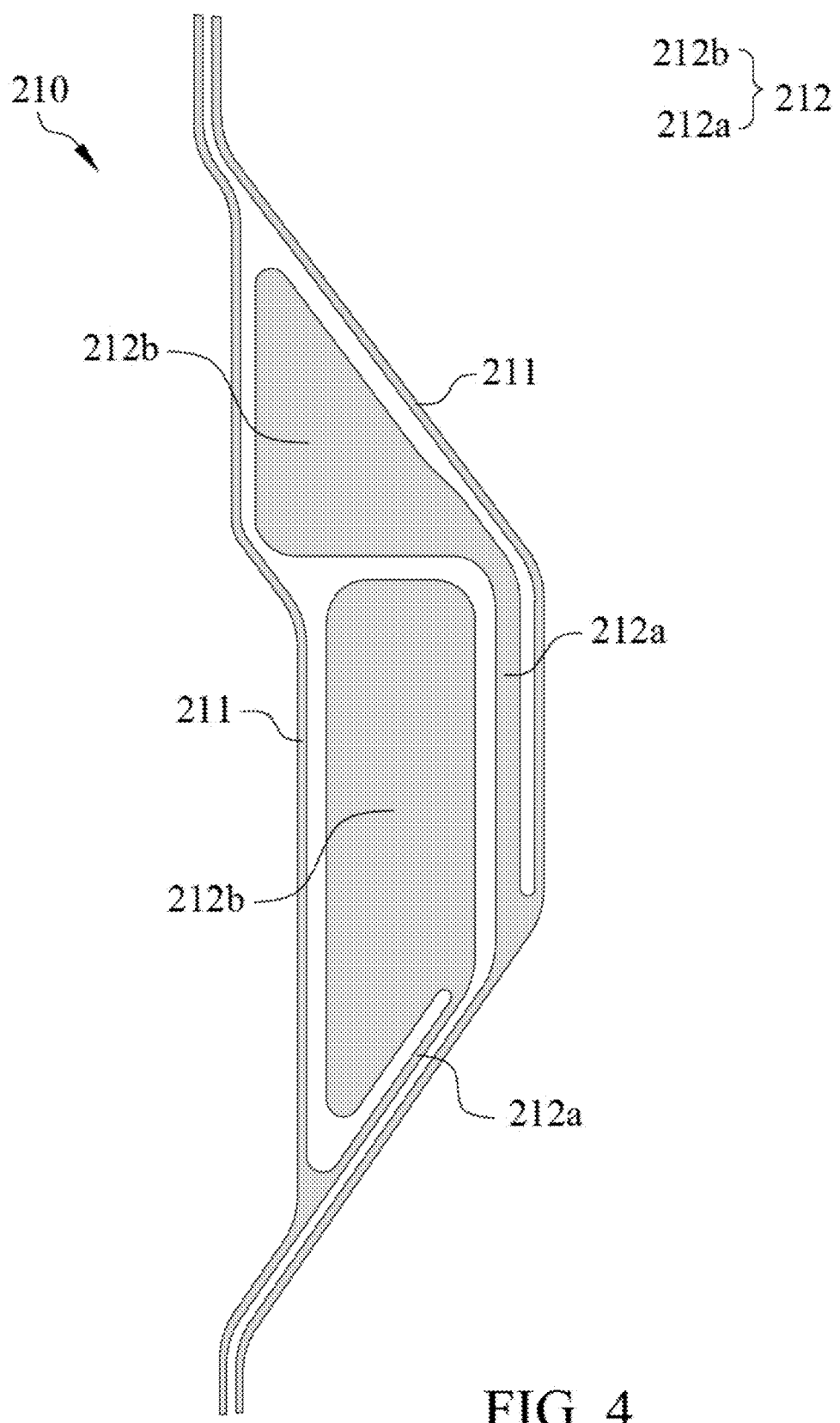
FIG. 4 is top view diagram illustrating a test circuit line in accordance with a preferred embodiment of the present invention.
Figure 5:
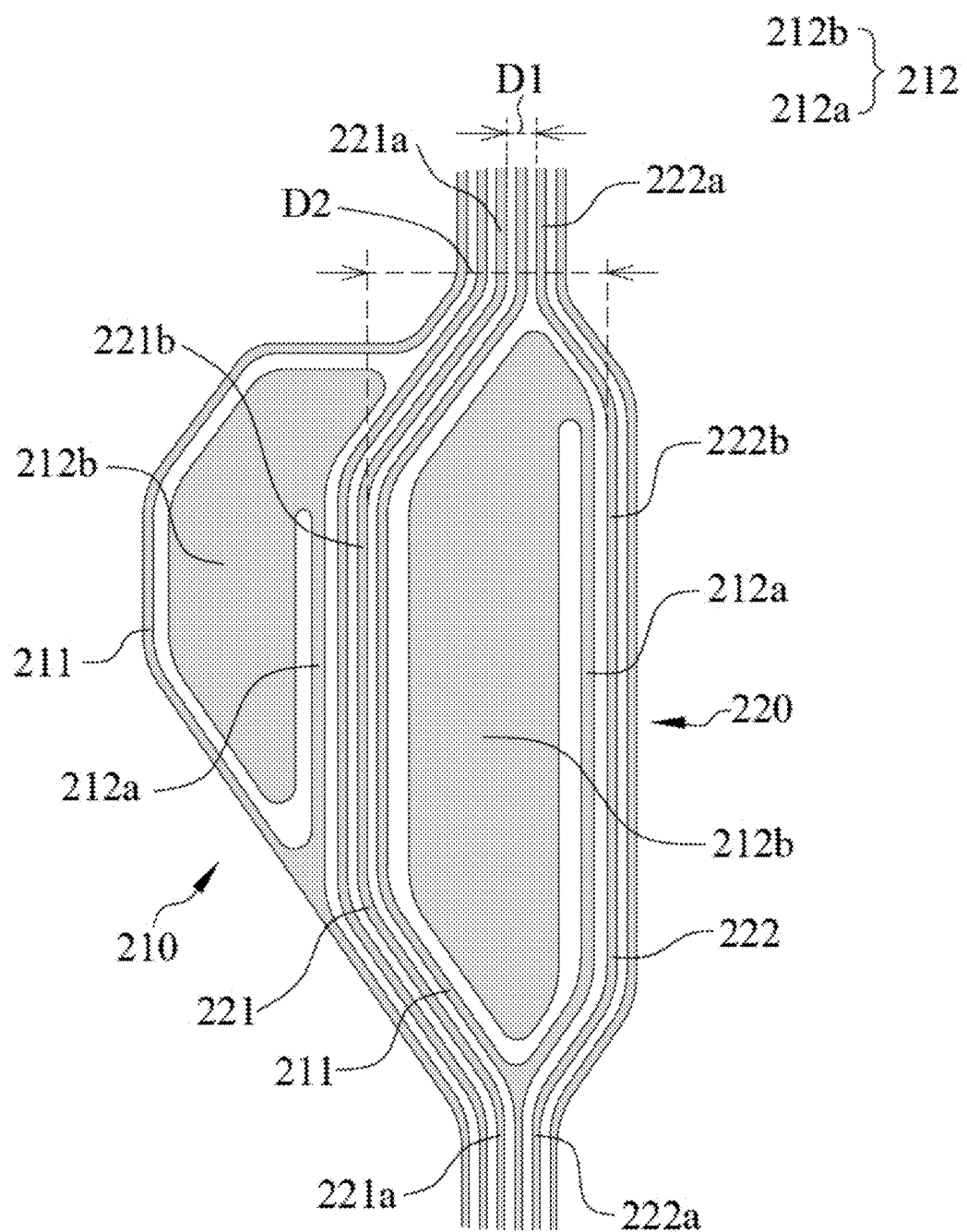
FIG. 5 is top view diagram illustrating a test circuit line in accordance with a preferred embodiment of the present invention.

With reference to FIGS. 3 to 5, the branch segment 212 includes a connection portion 212a and a test portion 212b, both ends of the connection portion 212a are connected to the main segment 211 and the test portion 212b respectively, and the test portion 212b is located at free end of the branch segment 212 for contacting with the test equipment. Preferably, the test portion 212b has a line width larger than that of the connection portion 212a and the main segment 211 so as to be benefit to the visual alignment of the test portion 212b. Furthermore, the junction of the connection portion 212a and the test portion 212b is curved such that the ductility of the branch segment 212 is improved to reduce the possibility of line breaking at the width variation between the connection portion 212a and the test portion 212b. Accordingly, the branch segment 211 is nonlinear.

With reference to FIGS. 1 and 3, the circuit layer 200 may further include at least one conductive circuit line 220 for different requirements, both ends of the conductive circuit line 220 are extended to the outer bonding area 111 and the inner bonding area 112, respectively. As same as the main segment 211 of the test circuit line 210, the conductive circuit line 220 is provided for bonding to the electronic device and the chip, but it has no branch segment. In the FIG. 3, it can be seen that the test portion 212b of the branch segment 212 is located between the main segment 211 and the conductive circuit line 220. Different to the test portion 212b shown in FIG. 3, the test portion 212b shown in FIG. 4 is located between the main segment 211 and another test circuit line 210. Otherwise, the test portion 212b may be located between the main segment 211 and the connection portion 212a as shown in FIG. 5. In the present invention, the arrangement of the test circuit line 210 and the conductive circuit line 220 are not restricted, and the length, pattern and location of the branch segment 212 relative to the main segment 211 are also not restricted.

With reference to FIG. 5, the circuit layer 200 preferably includes multiple test circuit lines 210 and conductive circuit lines 220. The circuit layer 200 at least includes a first conductive circuit line 221 and a second conductive circuit line 222, the first conductive circuit line 221 is located between the two adjacent test circuit lines 210, and one of the test circuit lines 210 is located between the first conductive circuit line 221 and the second conductive circuit line 222. In this embodiment, the first conductive circuit line 221 includes a first extension segment 221a and a first yielding segment 221b, the first extension segment 221a is connected to the first yielding segment 221b and extended outwardly from one end of the first yielding segment 221b, moreover, the second conductive circuit line 222 includes a second extension segment 222a and the second yielding segment 222b, and the second extension segment 222a is connected to the second yielding segment 222b and extended outwardly from one end of the second yielding segment 222b. The first extension segment 221a and the first yielding segment 221b correspond to the second extension segment 222a and the second yielding segment 222b, respectively, and a distance D2 between the first yielding segment 221b and the second yielding segment 222b is greater than a distance D1 between the first extension segment 221a and the second extension segment 222a. Particularly, the branch segment 212 of the test circuit line 210 is located in the space between the first yielding segment 221b and the second yielding segment 222b.

The first conductive circuit line 221 preferably includes two first extension segments 221a and one first yielding segment 221b, and both ends of the first yielding segment 221b are connected to the two first extension segments 221a, respectively. The second conductive circuit line 222 also preferably includes two second extension segments 222a and one second yielding segment 222b, and both ends of the second yielding segment 222b are connected to the two second extension segments 222a, respectively.

With reference to FIG. 1, the circuit board A preferably further includes a solder resist layer 300 that covers the test circuit lines 210 and the conductive circuit lines 220, but not cover circuit lines on the outer bonding area 111 and the inner bonding area 112. Besides, the solder resist layer 300 covering on the branch segment 212 is removable. In this embodiment, the solder resist layer 300 covering on the test portion 212a of the branch segment 212 is removable such that the test equipment can contact the exposed test portion 212a for electrical test.

During electrical test, the test equipment only contacts the branch segment 212, not contact the main segment 211. Consequently, breaking of the main segment 211 resulted from improper operation of the test equipment is preventable. And even if the branch segment 212 is broken during manufacture, delivery or test process, the main segment 211 is still available to be electrically connected to the electronic device and the chip without failure risk caused by the broken branch segment 212.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board comprising:
    a substrate; and
    a circuit layer formed on a surface of the substrate and including at least one test circuit line, the at least one test circuit line includes a main segment and a branch segment connected with each other, the branch segment is located between a first terminal and a second terminal of the main segment and is configured to be contacted with a test equipment for electrical test, wherein the branch segment includes a connection portion and a test portion, both ends of the connection portion are connected to the main segment and the test portion respectively, the test portion is located at a free end of the branch segment, not connected to the main segment, and configured to be contacted with the test equipment.

2. The circuit board in accordance with claim 1, wherein the test portion is wider than the connection portion.

3. The circuit board in accordance with claim 1, wherein the test portion is located between the main segment and the connection portion.

4. The circuit board in accordance with claim 1, wherein the test portion is located between the main segment and another test circuit line.

5. The circuit board in accordance with claim 1, wherein the circuit layer further includes at least one conductive circuit line, the test portion is located between the main segment and the at least one conductive circuit line.

6. The circuit board in accordance with claim 1, wherein the test portion is wider than the main segment.

7. The circuit board in accordance with claim 1, wherein the branch segment is nonlinear.

8. The circuit board in accordance with claim 1, wherein the first terminal of the main segment is located on an outer bonding area defined on the surface of the substrate and is configured to bond with an electronic device.

9. The circuit board in accordance with claim 8, wherein the second terminal of the main segment is located on an inner bonding area defined on the surface of the substrate and is configured to bond with a chip.

10. The circuit board in accordance with claim 1, wherein the second terminal of the main segment is located on an inner bonding area defined on the surface of the substrate and is configured to bond with a chip.

11. The circuit board in accordance with claim 1, wherein the circuit layer further includes a first conductive circuit line and a second conductive circuit line, the at least one test circuit line is located between the first and second conductive circuit lines.

12. The circuit board in accordance with claim 11, wherein the first conductive circuit line includes a first extension segment and a first yielding segment and the second conductive circuit line includes a second extension segment and a second yielding segment, a distance between the first and second yielding segments is greater than a distance between the first and second extension segments, and the branch segment of the at least one test circuit line is located between the first and second yielding segments.

13. The circuit board in accordance with claim 1, wherein the circuit layer includes a plurality of test circuit lines and a plurality of conductive circuit lines, one of the plurality of conductive circuit lines is located between two adjacent of the plurality of test circuit lines.

14. The circuit board in accordance with claim 1 further comprising a solder resist layer, wherein the solder resist layer covers the at least one test circuit line, and the solder resist layer covering on the branch segment is removable.

\* \* \* \* \*